United States Patent [19]
Feinberg et al.

[11] Patent Number: 4,546,413
[45] Date of Patent: Oct. 8, 1985

[54] ENGINEERING CHANGE FACILITY ON BOTH MAJOR SURFACES OF CHIP MODULE

[75] Inventors: Irving Feinberg; Charles J. Kraus, both of Poughkeepsie; Herbert I. Stoller, Wappingers Falls, all of N.Y.

[73] Assignee: International Business Machines Corporation, Armonk, N.Y.

[21] Appl. No.: 626,277

[22] Filed: Jun. 29, 1984

[51] Int. Cl.⁴ .............................................. H05K 7/06
[52] U.S. Cl. .................................... 361/410; 361/414; 361/395
[58] Field of Search ........................ 29/847; 174/68.5; 361/395, 397, 400, 403, 408, 409, 410, 414, 428

[56] References Cited
U.S. PATENT DOCUMENTS

| | | | |
|---|---|---|---|
| 2,963,626 | 12/1960 | Du Val, Jr. | 361/410 |
| 3,509,268 | 4/1967 | Schwarze et al. | 174/68.5 |
| 3,923,359 | 12/1975 | Newsam | 339/409 |
| 4,254,445 | 3/1981 | Ho | 361/409 |
| 4,371,744 | 2/1983 | Badet et al. | 174/68.5 |
| 4,434,321 | 2/1984 | Betts | 361/414 |

OTHER PUBLICATIONS

IBM Technical Disclosure Bulletin, vol. 21, No. 3, Aug. 1978, p. 956, "Method for Making Engineering Changes on Printed-Circuit Boards" R. L. Weiss.
IBM Technical Disclosure Bulletin, vol. 24, No. 11A, Apr. 1982, "Shared EC Pad Design", pp. 5554-5556, E. Hubacher.
IBM Technical Disclosure Bulletin, vol. 21, No. 10, Mar. 1979, "Metallized Multilayer Ceramic Packages with Welded I/O Pins", G. C. Phillips, Jr., pp. 3974-3975.

Primary Examiner—G. P. Tolin
Attorney, Agent, or Firm—Robert J. Haase

[57] ABSTRACT

A multiple chip module is provided with an engineering change (EC)/repair facility by means of delete lines located on both major surfaces of the module. In one embodiment, defective pin vias through the module are repaired by use of the delete lines on both major surfaces.

3 Claims, 2 Drawing Figures

ENGINEERING CHANGE FACILITY ON BOTH MAJOR SURFACES OF CHIP MODULE

BACKGROUND OF THE INVENTION

1. Field of the Invention

The present invention generally reates to an engineering change facility for a semiconductor device module or substrate on which multiple chips are mounted and, more particularly, to such a facility having delete lines on both major surfaces of the module.

2. Description of the Prior Art

Prior art packages for semiconductor devices have provided for making engineering changes or repairs subsequent to module manufacture. Generally, alternative circuit pathways are made available through the module or substrate on which multiple chips are mounted. If one of the circuit pathways is to be replaced because of design change or component failure, the undesired pathway is isolated electrically by deleting specially provided connecting line portions (delete lines) located on a major surface of the chip supporting module or substrate. The isolated, undesired circuit pathway then may be replaced by an added engineering change (EC) wire.

One example of an EC facility in which delete lines are provided on a major surface of a printed circuit board is described in U.S. Pat. No. 3,923,359, issued Dec. 2, 1975 to W. Newsom. Another is shown in U.S. Pat. No. 4,254,445, issued Mar. 3, 1981 to C. W. Ho and assigned to the present assignee. The latter deals with a semiconductor chip package.

In an article in the IBM ® Technical Disclosure Bulletin, August 1978, pg. 957, R. Weiss discloses another EC printed circuit board arrangement using delete lines on the upper board surface and substitute connecting wires over the bottom board surface which are added to the bottom of insulated pins extending through the board.

In each of the above cases, which are exemplary of the prior art, all EC delete lines are located on only one major surface of the board, module or substrate. Thus, all of the space required by the delete lines must be accommodated on the said one surface. Additionally, through-connections running between both major surfaces of the board, module or substrate cannot be fully electrically isolated from circuits connected thereto and bypassed simply by use of such delete lines.

SUMMARY OF THE INVENTION

Delete lines are placed on both major surfaces of a semiconductor chip module or substrate so that reduced major surface area is required to accommodate the engineering change (EC/repair facility and so that signal network connections can be electrically isolated and bypassed by using the delete lines. Provision is also made for pin replacement using delete lines on both major surfaces of the substrate.

BEST MODE FOR CARRYING OUT THE INVENTION

Figure 1:
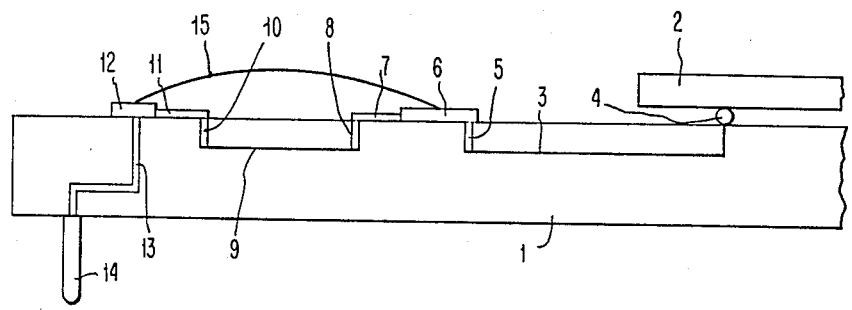
FIG. 1 is a cross-sectional view of a prior art semiconductor chip module incorporating delete line EC capability.

Referring to FIG. 1, a module 1 is made of a suitable dielectric or insulating material. In recent practice, it is likely to comprise a series of alternate conducting layers and insulating layers. The conducting layers (not shown) typically provide signal redistribution, power and ground plane facilities for the multiple chips (chip 2 being shown as an example) mounted thereon. Conductor 3 represents one of the signal redistribution lines internal to module 1 for connecting chip solder ball 4 to module via 5. Via 5 and chip EC pad 6 normally are conductively tied together and delete line 7, which can be broken by laser irradiation, for example, makes the connection to via 8. Signal wire 9 makes the connection from via 8 to via 10.

Via 10 is normally coupled to delete line 11. Pad 12, in turn, is connected to delete line 11 and to via 13 which contacts pin 14 extending from the bottom surface of module 1.

In the event that it is desired to remove wire 9 from the circuit for any one of various reasons (the wire has become open or short circuited or has been eliminated by a circuit design change), it can be removed merely by breaking delete lines 7 and 11. Wire 9 can be replaced by discrete wire 15 in the case of a repair, as is well understood in the art. However, in the prior art design of FIG. 1, a failure in pin via 13 cannot be repaired. Moreover, all of the delete lines are positioned on the upper major surface of module 1.

Figure 2:
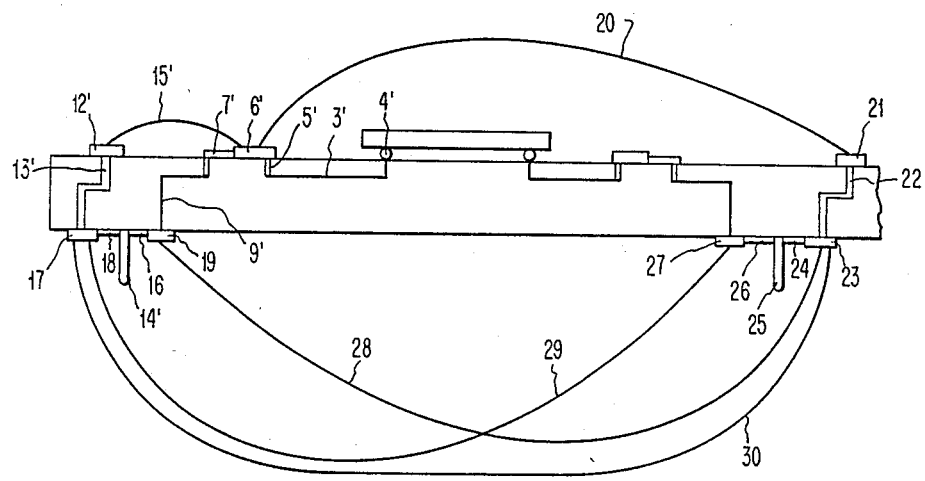
FIG. 2 is a cross-sectional view of an embodiment of the present invention enabling the isolation and the repairability of signal lines and replacement of pins.

In accordance with the present invention, on the other hand, the required number of EC pads and corresponding delete lines are divided between the upper and the lower major surfaces of the module to permit the use of smaller module surface areas allocated for each mounted chip, compatible with the continuing trend toward higher chip density per module. This is shown in FIG. 2.

As previously noted, the embodiment of FIG. 1 does not provide for any built-in, alternate signal path between the upper surface of the module and the pin extending from the lower surface thereof. This restriction of repair flexibility is eliminated by the way pin via 13' of FIG. 2 together with module EC pad 12' is used. Signal net 9' is now connected to EC pad 19 on the bottom of the module. Other structural components corresponding to FIG. 1 have been designated by primed similar numbers. With the added engineering change/repair flexibility of the embodiment of FIG. 2, it is not necessary to discard the entire module should a fault develop in pin via 13', since this will only be used if an EC or repair is required for signal net 9'. As before, signal wire 9' can be isolated, if necessary, by breaking delete lines 7' and 16 and repaired by attaching EC wire 15' from pad 6' to pad 12'.

This embodiment also enables the use of spare pads on the bottom of the module to be utilized in the event via 13' is open. This is accomplished by (1) deleting the defective signal line 9', as before; (2) connecting an EC wire 20 from 6' to 21; (3) cutting delete line 24; and (4) connecting EC wire 30 from pad 23 to pad 17.

In addition, this embodiment allows pins to be interchanged, thus possibly avoiding board EC's. This swapping is accomplished by: (1) cutting delete lines 16 and 26; (2) connecting EC wires 28 and 29 from pads 19 to 23 and from pads 17 to 27, respectively.

While the invention has been particularly shown and described with reference to the preferred embodiment thereof, it will be understood by those skilled in the art that various changes in form and detail may be made therein without departing from the spirit and scope of the invention.

What is claimed is:

1. A circuit module having circuit means on one major surface thereof and terminal means on the other surface thereof,
   a first selectively disconnectable delete line on said one surface,
   a second selectively disconnectable delete line on said other surface,
   a first conductive pathway extending through said module from said first delete line to said second delete line,
   said first conductive pathway and said delete lines being connectable in series circuit between said circuit means and said terminal means
   a third selectively disconnectable delete line on said other surface of said module, and
   a second conductive pathway extending through said module from said one surface of said module to said third delete line,
   said second conductive pathway and said third delete line being connectable in series circuit between said one surface and said terminal means,
   said second conductive pathway being connected to said circuit means and said terminal means when said third delete line is unbroken and at least one of said first and second delete lines are broken,
   said second conductive pathway being disconnected from at least one of said circuit means and said terminal means when both said first and second delete lines are unbroken.

2. The structure defined in claim 1 wherein said circuit means comprises a semiconductor device chip and said terminal means comprises a pin.

3. The structure defined in claim 2 wherein said second conductive pathway comprises a pin via.

* * * * *